United States Patent [19]

Hsu

[11] Patent Number: 5,631,486
[45] Date of Patent: May 20, 1997

[54] READ-ONLY-MEMORY HAVING BOTH BIPOLAR AND CHANNEL TRANSISTORS

[75] Inventor: Chen-Chung Hsu, Taichung, Taiwan

[73] Assignee: United Microelectronics Corporation, Hsinchu, Taiwan

[21] Appl. No.: 532,068

[22] Filed: Sep. 22, 1995

[51] Int. Cl.⁶ .................................................. H01L 29/06
[52] U.S. Cl. .................................... 257/390; 257/391
[58] Field of Search ........................ 257/390, 391

[56] References Cited

U.S. PATENT DOCUMENTS

| | | | |
|---|---|---|---|
| 5,014,243 | 5/1991 | Takada | 257/390 |
| 5,483,483 | 1/1996 | Choi et al. | 257/390 |

FOREIGN PATENT DOCUMENTS

| | | | |
|---|---|---|---|
| 0067666 | 4/1984 | Japan | 257/390 |

*Primary Examiner*—Sara W. Crane
*Assistant Examiner*—David B. Hardy
*Attorney, Agent, or Firm*—Cushman Darby & Cushman, IP Group of Pillsbury Madison & Sutro, LLP

[57] ABSTRACT

A structure for a read-only-memory (ROM) having both bipolar and channel transistors as memory cells to achieve efficient space utilization and higher density of ROM elements. The channel transistors include bit lines and word lines, with a threshold voltage at about 0.7 V. By implanting impurities into predetermined channel regions, memory cells become conductive or non-conductive. Bipolar transistors are formed in predetermined intersections of bit lines and word lines with a threshold voltage of about 3 V to 5 V, which can be treated as conductive memory cells that conduct current under 5 V operating voltage. Intersections of bit lines and word lines without bipolar transistors formed therein can be treated as non-conductive memory cells.

11 Claims, 2 Drawing Sheets

READ-ONLY-MEMORY HAVING BOTH BIPOLAR AND CHANNEL TRANSISTORS

BACKGROUND OF THE INVENTION

1. Field of Invention

The present invention relates to a structure for a read-only-memory (ROM), and more particularly to a structure for a ROM having both bipolar and channel transistors.

2. Description of Related Art

Read-only-memory has been extensively used in digital devices like mini computers, and microprocessor systems, for storing invariable programs for system operation. Since read-only-memory is invariable, usually a client first sends his program to a ROM manufacturing factory, then the program is built or coded into a ROM. After that the ROM is finished and sent to the client. The ROM manufacturing process is very complicated, involving many steps, each of which takes time and must be processed and controlled precisely. Because most ROM elements have the same structure but only differ in the data stored therein at the programming stage, process steps before the programming stage can be performed to produce half-finished products. When ROM elements are ordered by the client for storing a specified program, a mask for the program can be rapidly produced. The half-finished ROM elements can then be programmed and sent to the client as soon as possible. Therefore, post-programmed mask ROMs have become widely used in this art.

Conventional ROMs use channel transistors as memory cells. In the programming stage, impurities are selectively implanted into prescribed channel regions, to change their threshold voltage, and thus control the conduction of the channel transistors. FIG. 1 (Prior Art) shows a cross-sectional view of a conventional ROM using channel transistors. First, N-type impurities such as arsenic (As) are implanted into a silicon substrate 10 to form a plurality of equally spaced buried bit lines 11. Channel regions are simultaneously formed between the buried bit lines 11. Next, an oxidation step is performed. Due to different oxidation speeds, thick isolation layers 12a are formed on the buried bit lines 11 and thin oxide layers 12b are formed on the channel region. Then, a polysilicon layer is deposited and etched according to a pre-defined pattern to form word lines 13 across bit lines 11, so as to construct channel transistors. After that, a mask layer 14 is formed thereon and then etched to expose predetermined channel regions 15 which will be coded. P-type impurities, like boron, are implanted to complete the programming step.

The above-described conventional ROM arrangement occupies a large space because it uses channel transistors as memory cells. Additionally, impurities tend to diffuse in the programming step. As a result, the dimensions of ROM elements can not be reduced, which limits down-sizing of the ROM elements, and restricts the density of ROM elements per each unit area.

SUMMARY OF THE INVENTION

The primary object of the present invention is to provide a structure for a ROM which sufficiently utilizes the space of the substrate, to raise the density of ROM elements without reducing the dimensions of ROM elements, so as to provide more memory cells per each unit area.

This object is achieved by providing a new structural arrangement for a read-only-memory formed on a semiconductor substrate. The structure includes a plurality of buried bit lines of a first conductivity type, equally spaced on the substrate, forming channel regions therebetween. Predetermined channel regions to be later coded are implanted with impurities of a second conductivity type so as to become non-conductive. A gate oxide layer is formed on the channel regions. A plurality of thick oxide layers is formed on the buried bit lines. Predetermined ones of the thick oxide layers have openings therein. Base regions of the second conductivity type and emitter regions of the first conductivity type are formed in the buried bit lines beneath the openings so as to form bipolar transistors with the buried bit lines acting as collector regions of the first conductivity type. A plurality of word lines are formed above the gate oxide layer and the thick oxide layers and across the buried bit lines to construct channel transistors with the buried bit lines and the channel regions, the word lines being connected with the emitter regions through the openings.

BRIEF DESCRIPTION OF THE DRAWINGS

The present invention will become more fully understood from the detailed description given hereinafter and the accompanying drawings which are given by way of illustration only, and thus do not limit the scope of the claims presented herein.

FIG. (Prior Art) 1 is a cross-sectional view of the structure of the conventional ROM using channel transistor.

DETAILED DESCRIPTION OF THE PREFERRED EMBODIMENT

FIGS. 2A to 2E show the preferred embodiment of a ROM element, according to the present invention, formed on a substrate 20. In order to best describe the novel structure of the ROM element to those of ordinary skill in the semiconductor art, it is considered best to describe the novel structure of this invention in terms of the process by which it is fabricated.

Step 1

Figure 1:
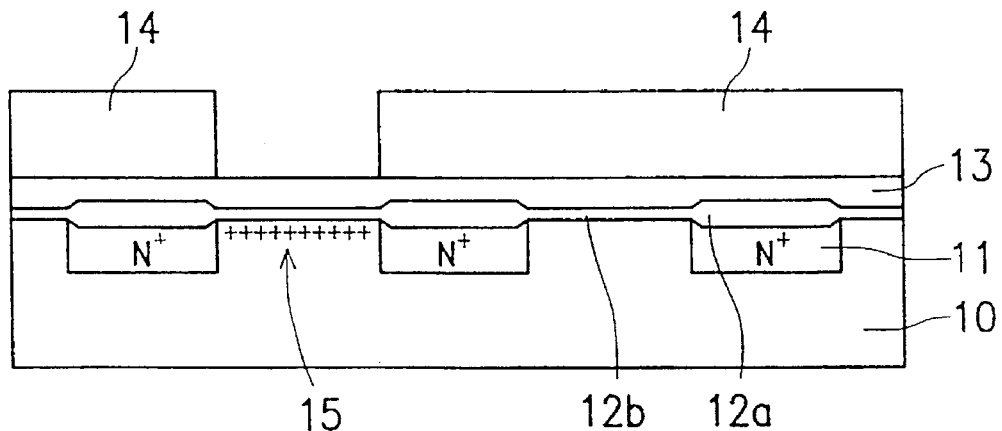
Figure 2A:
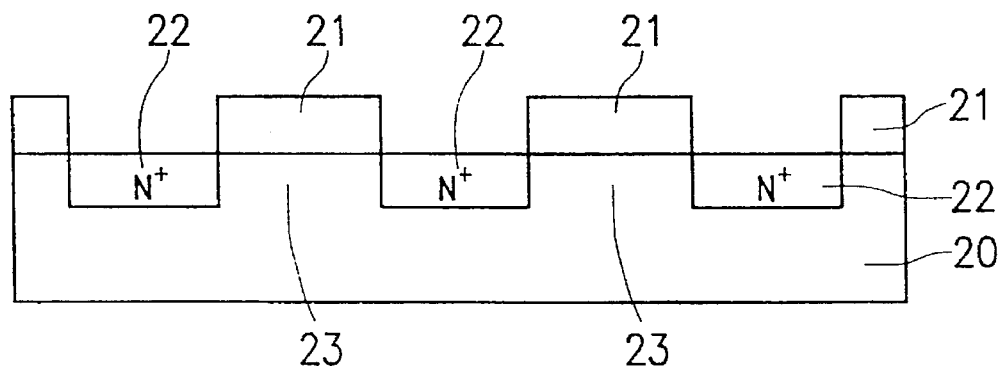
FIGS. 2A to 2E are cross-sectional views of a preferred embodiment of the structure of a ROM according to the present invention.

As shown in FIG. 2A, a photoresist layer 21 is deposited on a silicon substrate 20 and defined to form a pattern to expose the regions on the silicon substrate 20 where bit lines will be formed. Impurities of a first conductivity type, like N-type As ions, are implanted into the silicon substrate 20 using photoresist layer 21 as a mask to form a plurality of equally spaced $N^+$ buried bit lines 22 with a dosage between $1\times10^{14}$ and $1\times10^{16}$ atoms/cm$^2$, and a kinetic energy between 50 and 100 KeV. At the same time, the regions between the buried bit lines 22 form channel regions 23. After that, the photoresist layer 21 is removed by using an appropriate solvent.

Step 2

Figure 2B:
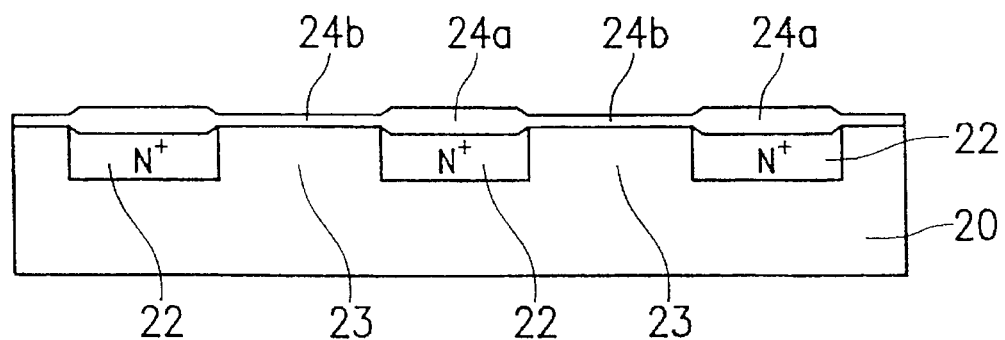

As shown in FIG. 2B, an oxide layer is formed on the substrate 20 at a temperature between 850° C. and 950° C. Due to differences of oxidation speeds, the oxide layer is divided into a first portion 24a above the buried bit lines 22 with a thickness between 800 and 1000 angstroms, and a second portion 24b above the channel regions 23 with a thickness between 250 and 300 angstroms.

Step 3

Figure 2C:
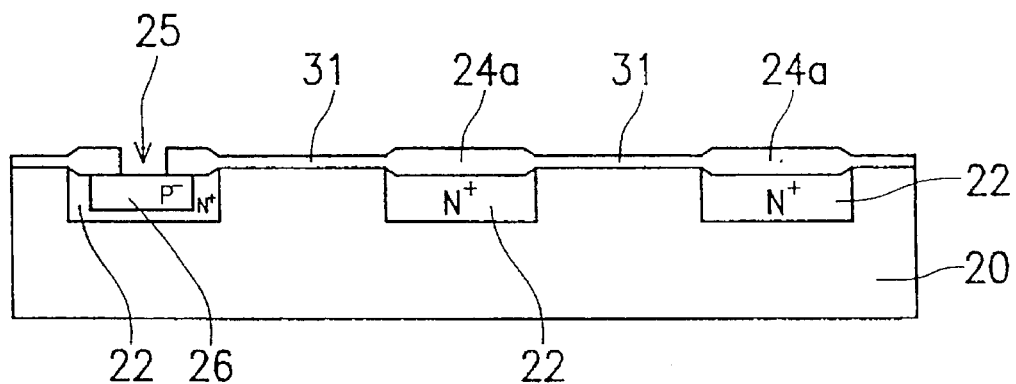

As shown in FIG. 2C, ion implantation is performed to adjust the threshold voltage of the channel regions 23 to about 0.7 V. Then the second portion 24b of the oxide layer is removed. A gate oxide layer 31 with a thickness about 80 to 250 angstroms is formed by thermal oxidation at about 900° C. Openings 25 are formed on the first portions 24a by using an anisotropic etching technique, like reactive ion etching (RIE), to expose a portion of the buried bit lines 22. Impurities of second conductivity type, like P-type Boron ions, can be implanted into the buried bit lines 22 via the openings 25 to form P⁻ base regions 26, using a dosage between $1 \times 10^{12}$ and $1 \times 10^{13}$ atoms/cm², and a kinetic energy between 20 and 50 KeV.

Step 4

Figure 2D:
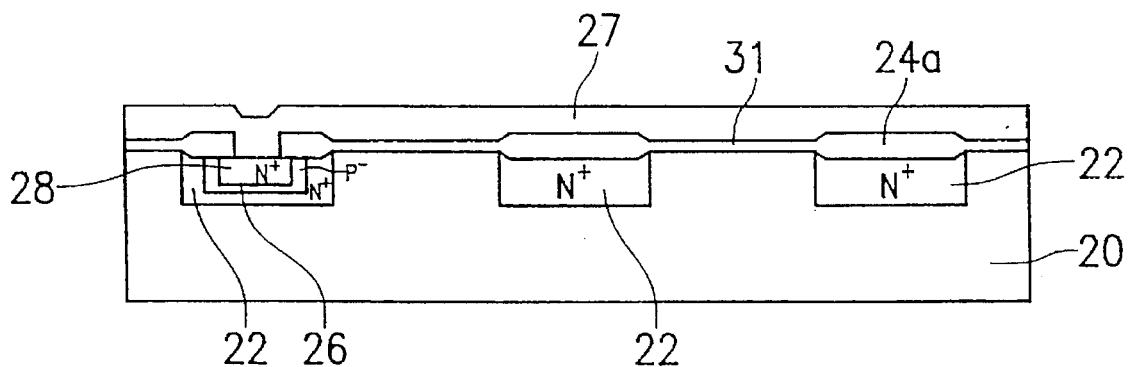

As shown in FIG. 2D, a polysilicon layer is deposited on the first portion 24a and the gate oxide layer 31, and impurities can be implanted into the polysilicon layer to increase its conductivity by, for example, implanting phosphorous ions with a dosage between $1 \times 10^{14}$ and $1 \times 10^{16}$ atoms/cm², and a kinetic energy between 30 and 60 KeV. Then, the pattern of the polysilicon layer is defined by conventional lithography and etching techniques to form a plurality of word lines 27 across the buried bit lines 22, thereby constructing the channel transistors. The word lines 27 are connected to the P⁻ base region 26 through openings 25. After that, a thermal annealing process is performed by, for example, heating the substrate 20 within nitrogen atmosphere at about 900° C., so that the phosphorous ions in the word lines 27 are diffused into the P⁻ type base region 26 to form N⁺ emitter region 28, while a bipolar transistor is formed using the N⁺ buried bit line 22 as a collector region. It should be noted that if the thickness of the base region 26 is controlled to be less than 0.1 μm, the threshold voltage is thereby controlled to be between 3 V to 5 V.

Step 5

Figure 2E:
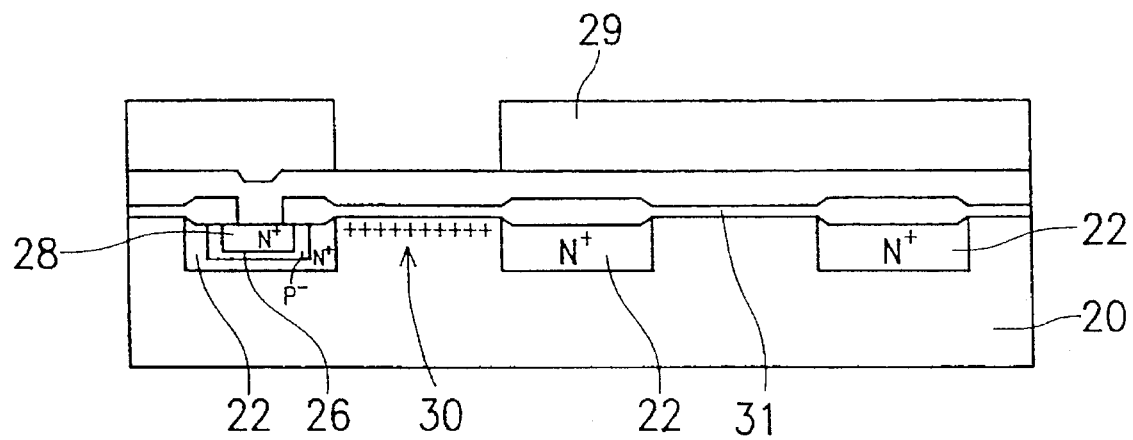

As shown in FIG. 2E, another photoresist layer 29 is deposited and defined with the coded pattern. Using photoresist layer 29 as a mask, impurities of the second conductivity type are implanted into the channel regions 30 which are to be coded to become non-conductive. This is done by, for example, implanting P-type boron ions with a dosage between $5 \times 10^{13}$ and $5 \times 10^{14}$ atoms/cm², and a kinetic energy between 120 and 150 KeV.

Although not described in detail, it is apparent that the first conductivity type could be either P-type or N-type, and the second conductivity type could be either N-type or P-type. This is familiar to those skilled in the art.

As stated above, the channel transistors constructed by the bit lines 22 and word lines 27 form conventional memory cells. In addition, the intersections of the bit lines 22 and the word lines 27 further form extra memory cells. Therefore, more memory cells are provided and the density of memory cells is increased without reducing the dimensions of the ROM elements per a unit area. The threshold voltage of the channel transistor is about 0.7 V. By implanting impurities into predetermined channel regions, the channel transistor memory cells can be set to be conductive or non-conductive. The threshold voltage of the bipolar transistors formed at parts of the intersections of the bit lines 22 and the word lines 27 is controlled between 3 V and 5 V, therefore the operation of the channel transistors under 3 V will not affect the bipolar transistors. When a word line 27 is operated at about 5 V and a bit line 22 is selected, the selected bit line 22 will conduct current with the word line 27 if there is a bipolar transistor formed at the intersection, while the bit line 22 will not conduct current with the word line 27 if there is no bipolar transistor existing at the intersection. In this manner, data can be stored in and read from the intersections of the bit lines 22 and word lines 27.

While the invention has been described by way of examples and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A structure for a read-only-memory on a semiconductor substrate comprising:

a plurality of buried bit lines of a first conductivity type, equally spaced on the substrate, forming channel regions therebetween, predetermined ones of which to be later coded being implanted with impurities of a second conductivity type to become non-conductive;

a gate oxide layer formed on said channel regions;

a plurality of thick oxide layers formed on said buried bit lines, predetermined ones of said thick oxide layers having openings therein;

base regions of the second conductivity type and emitter regions of the first conductivity type, formed in said buried bit lines beneath said openings, constructing bipolar transistors with said buried bit lines as collector regions of the first conductivity type; and a plurality of word lines, formed above said gate oxide layer and said thick oxide layers and across said buried bit lines to construct channel transistors with said buried bit lines and said channel regions, said word lines being connected with said emitter regions through said openings.

2. A structure as claimed in claim 1, wherein said first conductivity type is N-type and said second conductivity type is P-type.

3. A structure as claimed in claim 1, wherein the thickness of said base regions is less than about 0.1 μm.

4. A structure as claimed in claim 1, wherein said word lines are made from polysilicon.

5. A structure as claimed in claim 1, wherein the thickness of said gate oxide layers is between about 80 and 250 angstroms, and wherein the thickness of said thick oxide layers is between about 800 and 1000 angstroms.

6. A memory array comprising:

a semiconductor substrate having a plurality of buried bit lines formed therein and a plurality of word lines formed thereon, said word lines and buried bit lines intersecting with each other to construct channel-transistor memory cells; and a plurality of bipolar-transistor memory cells formed in said buried bit lines at the intersections of said word lines and buried bit lines.

7. A memory array as claimed in claim 6, wherein predetermined ones of said bipolar-transistor memory cells are conductive while the other are non-conductive, said conductive bipolar-transistor memory cells including base regions formed in said buried bit lines, emitter regions formed in said base regions and connecting to said word lines, and collector regions served by said buried bit lines; and said non-conductive bipolar-transistor memory cells including oxide layer formed between said word lines and buried bit lines.

8. A memory array as claimed in claim 7, wherein the thickness of said base regions is less than about 0.1 μm.

9. A memory array as claimed in claim 7, wherein the thickness of said oxide layers is between about 800 and 1000 angstroms.

10. A read-only memory structure comprising:

a substrate;

a plurality of buried bit lines formed in said substrate;

an oxide layer formed over said buried bit lines;

at least one word line formed on said oxide layer and crossing said buried bit lines;

a plurality of channel regions respectively formed in said substrate between said buried bit lines and below said word line so as to define a plurality of channel transistor memory cells; and at least one bipolar transistor memory cell formed in said substrate at an intersection of one of said buried bit lines and said word line, said one buried bit line connected to a collector region thereof, said word line connected to an emitter region thereof through an opening in said oxide layer.

11. A read-only memory structure as defined in claim 10, wherein a threshold voltage of said bipolar transistor memory cell is between about 3 V and 5 V, and wherein a threshold voltage of said channel transistor memory cells is about 0.7 V.

\* \* \* \* \*